US012615791B2

(12) United States Patent
Ikura

(10) Patent No.: US 12,615,791 B2
(45) Date of Patent: Apr. 28, 2026

(54) SEMICONDUCTOR DEVICE

(71) Applicant: FUJI ELECTRIC CO., LTD.,
Kawasaki (JP)

(72) Inventor: Yoshihiro Ikura, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 568 days.

(21) Appl. No.: 18/160,214

(22) Filed: Jan. 26, 2023

(65) Prior Publication Data

US 2023/0282738 A1    Sep. 7, 2023

(30) Foreign Application Priority Data

Mar. 7, 2022    (JP) ................................. 2022-034832

(51) Int. Cl.
*H10D 62/60*          (2025.01)
*H10D 12/00*          (2025.01)
(52) U.S. Cl.
CPC ........... *H10D 12/481* (2025.01); *H10D 62/60*
(2025.01)
(58) Field of Classification Search
CPC .......... H10D 12/411–491; H10D 12/031–038;
H10D 62/141–148; H10D 84/40–409;
H10D 12/032–038; H10D 12/441–491;
H10D 12/035; H10D 18/221; H10D
62/60; H10D 8/422; H10D 64/23; H10D
62/106; H10D 62/127; H10D 64/117;
H10D 84/401–409; H10D 12/481
See application file for complete search history.

(56) References Cited

U.S. PATENT DOCUMENTS

2016/0240638 A1* 8/2016 Ikura .................... H10D 62/106
2018/0286971 A1   10/2018 Philippou et al.
2023/0335625 A1* 10/2023 Zhu ........................ H10D 30/63

FOREIGN PATENT DOCUMENTS

JP        H11-345969 A    12/1999
JP        2016-184712 A   10/2016
JP        2018-182313 A   11/2018

* cited by examiner

*Primary Examiner* — Moin M Rahman
(74) *Attorney, Agent, or Firm* — Rabin & Berdo, P.C.

(57) ABSTRACT

A semiconductor device, including a semiconductor sub-
strate, a first semiconductor region, a plurality of second
semiconductor regions, a plurality of third semiconductor
regions, a fourth semiconductor region, a plurality of
trenches provided in the semiconductor substrate, a plurality
of first electrodes respectively provided in the plurality of
trenches, an interlayer insulating film, a second electrode,
and a third electrode. The trenches are disposed at equal
intervals, so as to have a plurality of mesa portions formed
therebetween. The trenches include a plurality of gate
trenches and a plurality of dummy trenches. The first elec-
trodes include a plurality of gate electrodes and a plurality
of dummy electrodes. The plurality of mesa portions
includes a plurality of first mesa portions, each first mesa
portion being adjacent to one of the gate trenches at least at
one sidewall thereof, and including one of the second
semiconductor regions that has a floating potential.

6 Claims, 11 Drawing Sheets

Emitter n+ n+

Figure 10:
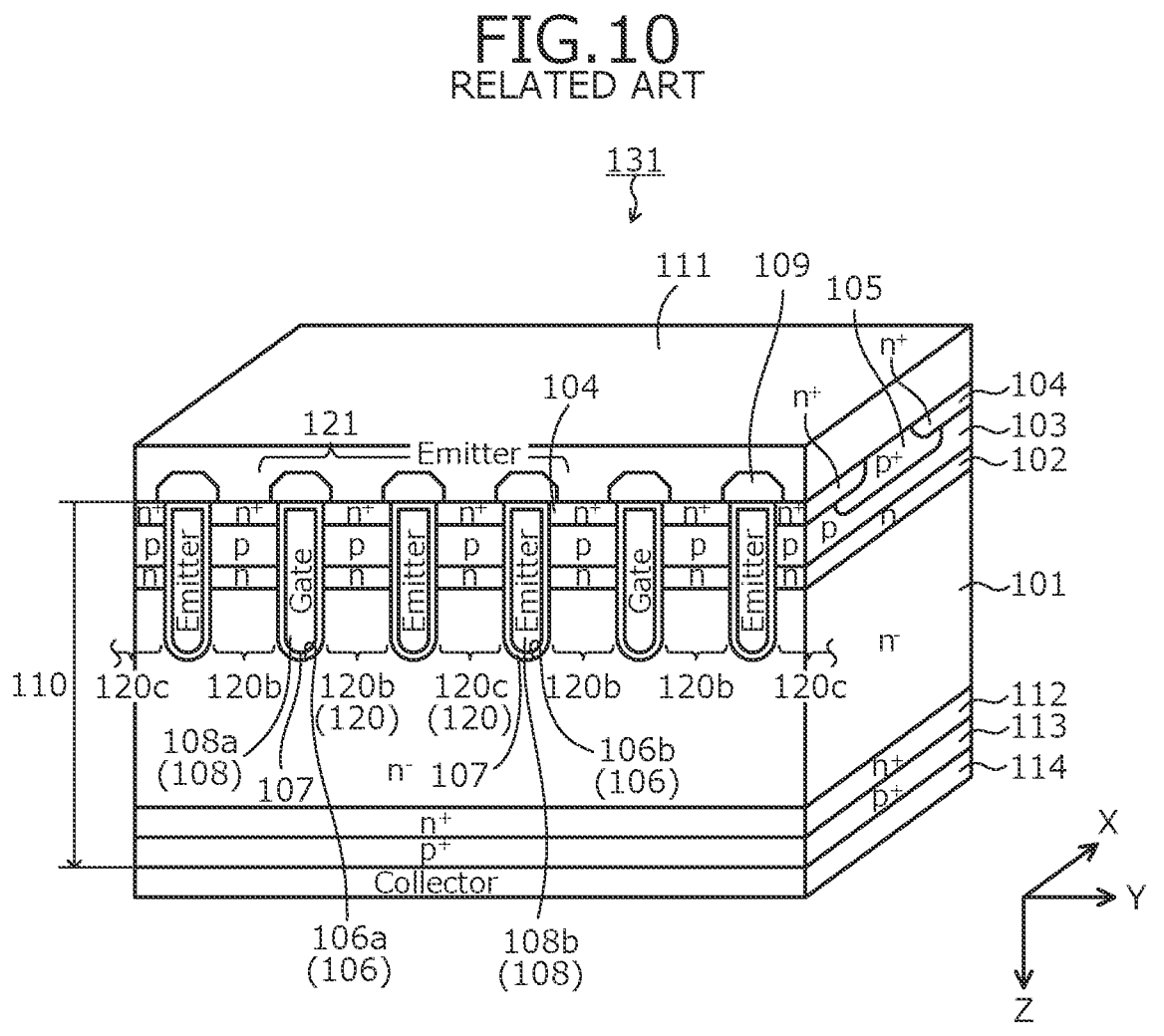

104
103
102 n

101 n-

110  120c  120b  120b  120c  120b  120b  120c 112
113
114

108a
(108)  107 n-  107

106b
(106)

n+
p+
Collector 106a
(106)

108b
(108)

X

Y

Z

SEMICONDUCTOR DEVICE

CROSS REFERENCE TO RELATED APPLICATIONS

This application is based upon and claims the benefit of priority of the prior Japanese Patent Application No. 2022-034832, filed on Mar. 7, 2022, the entire contents of which are incorporated herein by reference.

BACKGROUND OF THE INVENTION

1. Field of the Invention

Embodiments of the invention relate to a semiconductor device.

2. Description of the Related Art

Conventionally, a commonly known structure of a trench gate insulated gate bipolar transistor (IGBT) includes trenches (hereinafter, gate trenches) in which gate electrodes are embedded via an insulating film (gate insulating film) and trenches (hereinafter, the dummy trenches) in which dummy electrodes of an emitter potential are embedded via an insulating film. A front surface of a semiconductor substrate is in contact with an emitter electrode at portions (mesa portions) between all adjacent trenches.

A structure of a conventional trench gate IGBT is described. FIG. 10 is a perspective view depicting the structure of a conventional semiconductor device. FIG. 11 is a perspective view depicting another example of the structure of a conventional semiconductor device. A conventional semiconductor device 131 depicted in FIG. 10 is a trench gate IGBT that has, in a front side of a semiconductor substrate (semiconductor chip) 110, trenches 106 in which electrodes 108 are embedded via an insulating film 107. The trenches 106 are disposed in a striped pattern that extends in a first direction X that is parallel to a front surface of the semiconductor substrate 110.

In the trenches 106, the insulating film 107 is provided along inner walls of the trenches 106 and the electrodes 108 are provided on the insulating film 107 so as to be embedded in the trenches 106. The electrodes 108 in a set of trenches (gate trenches) 106a among the trenches 106 are a gate electrodes 108a of the IGBT (the semiconductor device 131) while the electrodes 108 in the remaining trenches (dummy trenches) 106b, excluding the gate trenches 106a, are dummy electrodes 108b of the IGBT, the dummy electrodes 108b having an emitter potential (potential of an emitter electrode 111).

In a second direction Y that is parallel to the front surface of the semiconductor substrate 110 and orthogonal to the first direction X, two of the dummy trenches 106b are disposed for every one of the gate trenches 106a disposed. As for arrangement of the trenches 106, a base unit portion 121 that includes one of the gate trenches 106a and two of the dummy trenches 106b is disposed in plural and in parallel in the second direction Y. In FIG. 10, the gate electrodes 108a are indicated by "Gate" and the dummy electrodes 108b are indicated by "Emitter" (similarly in FIG. 11).

Portions (mesa portions) 120 between the adjacent trenches 106 include mesa portions 120b that are each between a respective one of the gate trenches 106a and an adjacent one of the dummy trenches 106b, and mesa portions 120c that are each between a respective adjacent two of the dummy trenches 106b, all having a same cell structure. In all the mesa portions 120 (120b, 120c), n-type storage regions 102, p-type base regions 103, n⁺-type emitter regions 104, and p⁺-type contact regions 105 are each selectively provided between the front surface of the semiconductor substrate 110 and an n⁻-type drift region 101.

The n-type storage regions 102 are provided between the p-type base regions 103 and the n⁻-type drift region 101. The p-type base regions 103 are provided between the front surface of the semiconductor substrate 110 and the n-type storage regions 102. The n⁺-type emitter regions 104 and the p⁺-type contact regions 105 are each selectively provided between the front surface of the semiconductor substrate 110 and the p-type base regions 103.

The n⁻-type drift region 101, the n-type storage regions 102, the p-type base regions 103, and the n⁺-type emitter regions 104 are in contact with the insulating film 107 at sidewalls of the trenches 106 (the gate trenches 106a at portions adjacent to the gate trenches 106a, the dummy trenches 106b at portions adjacent to the dummy trenches 106b). In other words, the trenches 106 penetrate through the n⁺-type emitter regions 104, the p-type base regions 103, and the n-type storage regions 102 in a depth direction Z from the front surface of the semiconductor substrate 110 and terminate in the n⁻-type drift region 101.

All the mesa portions 120 (120b, 120c), at the front surface of the semiconductor substrate 110, are in contact with the emitter electrode 111 and fixed to the potential of the emitter electrode 111. An n⁺-type buffer region 112 is provided between a back surface of the semiconductor substrate 110 and the n⁻-type drift region 101. The p⁺-type collector region 113 is provided between the back surface of the semiconductor substrate 110 and the n⁺-type buffer region 112. A collector electrode 114 is provided on the entire back surface of the semiconductor substrate 110. Reference numeral 109 is an interlayer insulating film.

A conventional semiconductor device 132 depicted in FIG. 11 differs from the conventional semiconductor device 131 depicted in FIG. 10 in that a base unit portion 122 in which the trenches 106 are repeatedly disposed includes an adjacent two of the gate trenches 106a, the adjacent two being disposed adjacent to each other in the second direction Y. In the second direction Y, for every two of the gate trenches 106a disposed, four of the dummy trenches 106b are disposed. In an arrangement of the trenches 106, the base unit portion 122, which includes two of the gate trenches 106a and four of the dummy trenches 106b, is disposed in plural and in parallel in the second direction.

The mesa portions 120 between the trenches 106 that are adjacent to each other include first mesa portions 120a each of which is between a respective adjacent two of the gate trenches 106a, the second mesa portions 120b each of which is between a respective one of the gate trenches 106a and one of the dummy trenches 106b adjacent thereto, and the third mesa portions 120c each of which is between a respective adjacent two of the dummy trenches 106b, all having the same cell structure. All the mesa portions 120 (the first to third mesa portions 120a to 120c), at the front surface of the semiconductor substrate 110, are in contact with the emitter electrode 111 and fixed to the potential (emitter potential) of the emitter electrode 111.

In the conventional semiconductor devices 131, 132 depicted in FIGS. 10 and 11, when voltage that is at least equal to a gate threshold voltage is applied to the gate electrodes 108a while voltage (forward voltage) that is positive with respect to the emitter electrode 111 is applied to the collector electrode 114, a channel (n-type inversion layer) is formed only in portions of the p-type base regions 103 along the gate trenches 106a. As a result, pn junctions between the p⁺-type collector region 113 and the n⁺-type buffer region 112 are forward biased and the IGBT (the semiconductor devices 131, 132) turn ON.

When the IGBT is ON, holes are injected into the n⁻-type drift region 101 from the p⁺-type collector region 113, via the n⁺-type buffer region 112, whereby electrons are injected into the n⁻-type drift region 101 from the n⁺-type emitter regions 104 via the channel and the n-type storage regions 102, carrier concentration of the n⁻-type drift region 101 increases, and conductivity modulation occurs. Due to the conductivity modulation, the resistance value of the n⁻-type drift region 101 decreases and voltage drops in the forward direction are suppressed and thus, the IGBT becomes a switching device that turns ON by a low ON voltage.

As a conventional trench gate IGBT, a device has been proposed in which a mesa portion and a bottom of a dummy trench are connected to each other by a p-type region, whereby gate controllability for noise during switching is enhanced (for example, refer to Japanese Laid-Open Patent Publication No. 2018-182313). Japanese Laid-Open Patent Publication No. 2018-182313 discloses a structure that includes a gate trench and a dummy trench embedded with an electrode of an emitter potential, an electrically floating potential, or another gate potential, and in which a mesa portion free of an n⁺-type emitter region is electrically floating.

Further, as another conventional trench gate IGBT, a device has been proposed in which an n⁺-type emitter region is disposed only adjacent to a sidewall of a trench gate; a trench that is not adjacent to an n⁺-type emitter region is regarded to be a dummy trench, whereby safely operating regions are increased (for example, refer to Japanese Laid-Open Patent Publication No. 2016-184712). Japanese Laid-Open Patent Publication No. 2016-184712 discloses a structure in which for every 2 gate trenches disposed, two dummy gate trenches are disposed; between a portion of the gate trenches that are adjacent to one another or the dummy trenches that are adjacent to one another, only an electrically floating p-type base regions is disposed.

Further, as yet another conventional trench gate IGBT, a device has been proposed in which only a portion of multiple n⁺-type emitter regions are connected to an emitter electrode, whereby electron injection is promoted and the ON voltage is reduced (for example, refer to Japanese Laid-Open Patent Publication No. H11-345969). Japanese Laid-Open Patent Publication No. H11-345969 discloses a structure in which all trenches are gate trenches; the gate trenches separate cells in which n⁺-type emitter regions are disposed and a channel is formed and dummy cells that are free of the n⁺-type emitter regions and in which only p-type base regions are disposed; and the dummy cells are electrically floating.

SUMMARY OF THE INVENTION

According to an embodiment of the invention, a semiconductor device includes: a semiconductor substrate having a first surface and a second surface that are opposite to each other; a first semiconductor region of a first conductivity type, the first semiconductor region being provided in the semiconductor substrate; a plurality of second semiconductor regions of a second conductivity type, the second semiconductor regions being provided between the first surface of the semiconductor substrate and the first semiconductor region; a plurality of third semiconductor regions of the first conductivity type, the third semiconductor regions being selectively provided between the first surface of the semiconductor substrate and the second semiconductor regions; a fourth semiconductor region of the second conductivity type, the fourth semiconductor region being provided between the second surface of the semiconductor substrate and the first semiconductor region; a plurality of trenches provided in the semiconductor substrate, from the first surface of the semiconductor substrate; a plurality of first electrodes respectively provided in the plurality of trenches, each via an insulating film; an interlayer insulating film provided on the first surface of the semiconductor substrate, the interlayer insulating film covering the first electrodes and having a plurality of contact holes formed therein; a second electrode provided at the first surface of the semiconductor substrate, the second electrode being electrically connected to the second semiconductor regions and the third semiconductor regions via the plurality of contact holes of the interlayer insulating film; and a third electrode provided on the second surface of the semiconductor substrate, the third electrode being electrically connected to the fourth semiconductor region. The trenches are disposed at equal intervals, so as to have a plurality of mesa portions formed therebetween, the trenches including a plurality of gate trenches that penetrate through the third semiconductor regions and the second semiconductor regions and reach the first semiconductor region, and a plurality of dummy trenches that penetrate through the second semiconductor regions and reach the first semiconductor region. The first electrodes include: a plurality of gate electrodes respectively provided in the gate trenches, and a plurality of dummy electrodes respectively provided in the dummy trenches and electrically connected to the second electrode. The plurality of mesa portions includes a plurality of first mesa portions, each first mesa portion being adjacent to one of the gate trenches at least at one sidewall thereof, and including one of the second semiconductor regions that has a floating potential.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a perspective view depicting a structure of a semiconductor device according to a first embodiment.

FIG. 3 is a perspective view depicting another example of the structure of the semiconductor device according to the first embodiment.

FIG. 5 is a perspective view depicting the structure of a semiconductor device according to a second embodiment.

FIG. 10 is a perspective view depicting a structure of a conventional semiconductor device.

DETAILED DESCRIPTION OF THE INVENTION

Figure 11:
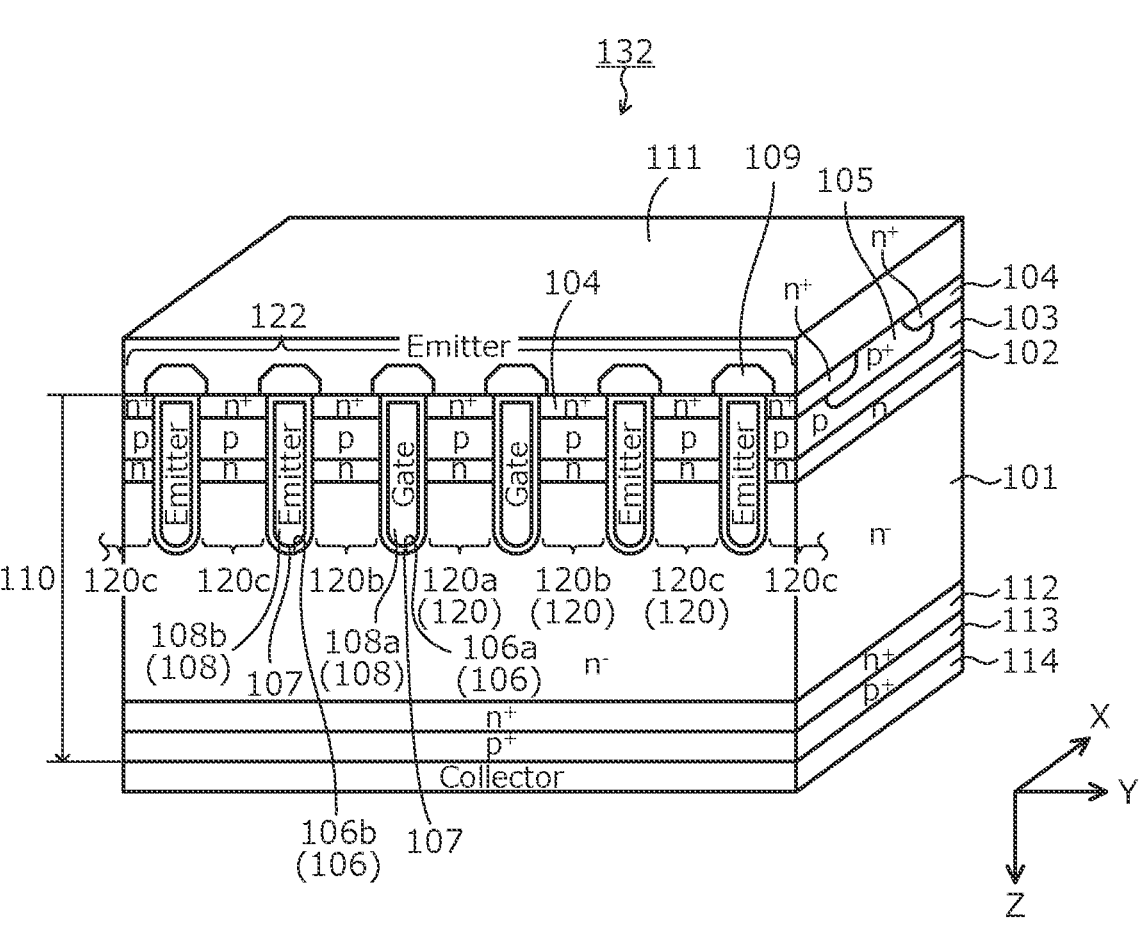
FIG. 11 is a perspective view depicting another example of the structure of a conventional semiconductor device.

First, problems associated with the conventional techniques are discussed. In the conventional IGBTs (the semiconductor devices 131, 132, refer to FIGS. 10 and 11), switching loss during turn-on (hereinafter, turn-on loss) Eon and the dV/dt (rate of change of voltage per unit time, hereinafter, reverse recovery dV/dt) of anode-cathode voltage during reverse recovery of a diode connected in anti-parallel to the IGBT have a tradeoff relationship. In particular, by increasing the gate resistance of the IGBT, reverse recovery dV/dt, which causes noise, may be suppressed, however, the turn-on loss Eon increases. On the other hand, by reducing the gate resistance of the IGBT, the turn-on loss Eon may be reduced, however, the reverse recovery dV/dt increases.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 1:
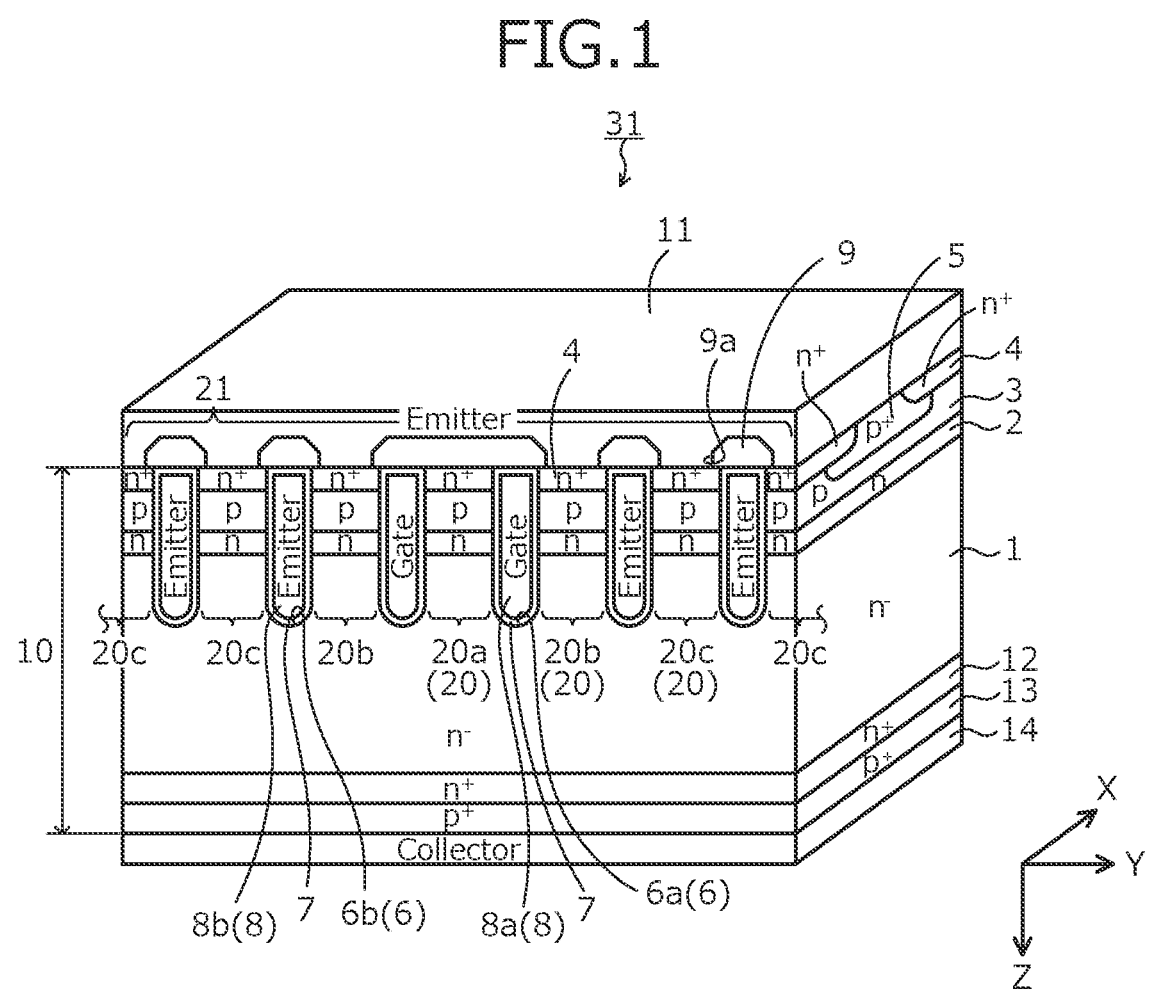
Figure 2:
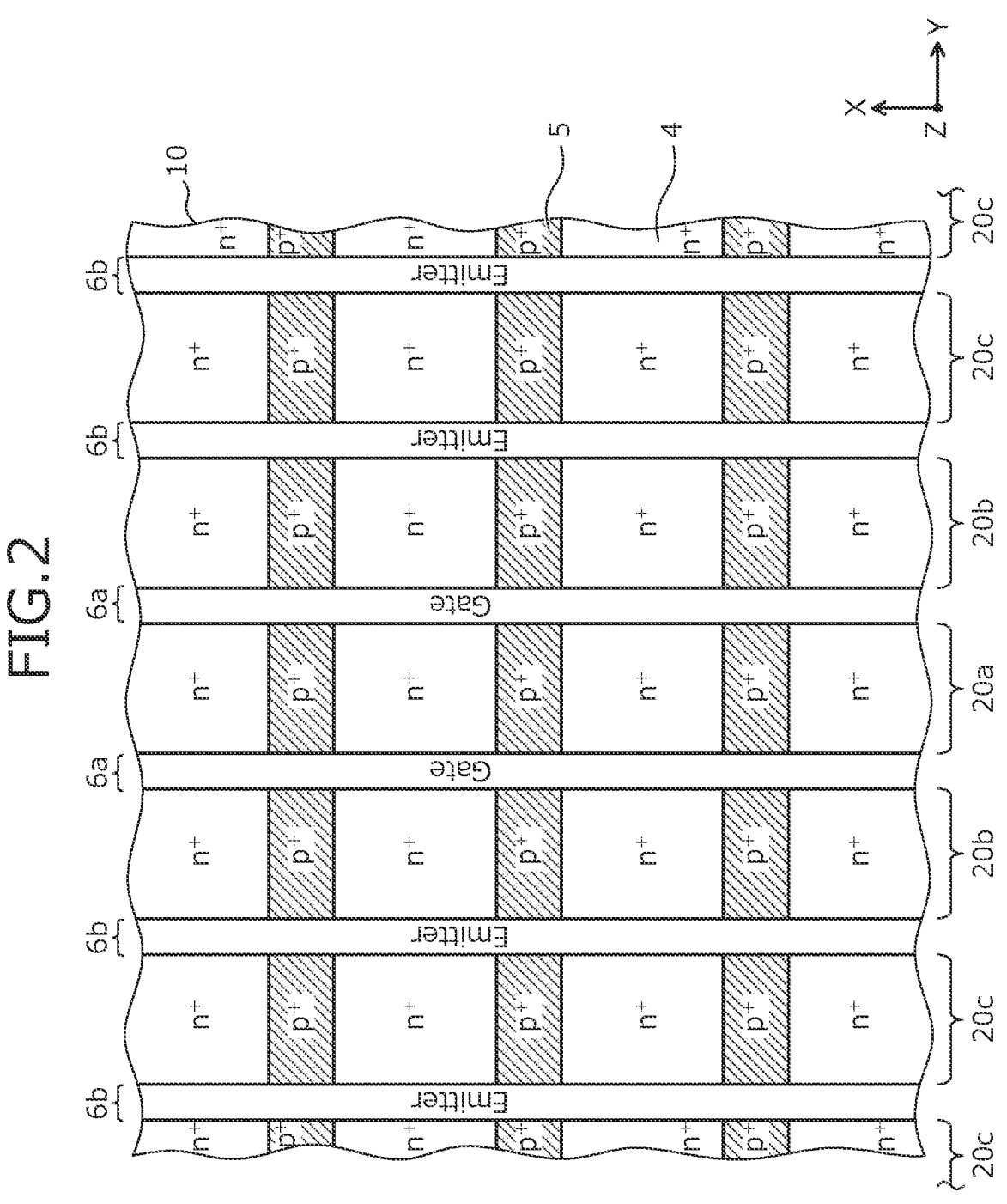
FIG. 2 is a plan view depicting a layout when the semiconductor device in FIG. 1 is viewed from a front side of a semiconductor substrate.
Figure 3:
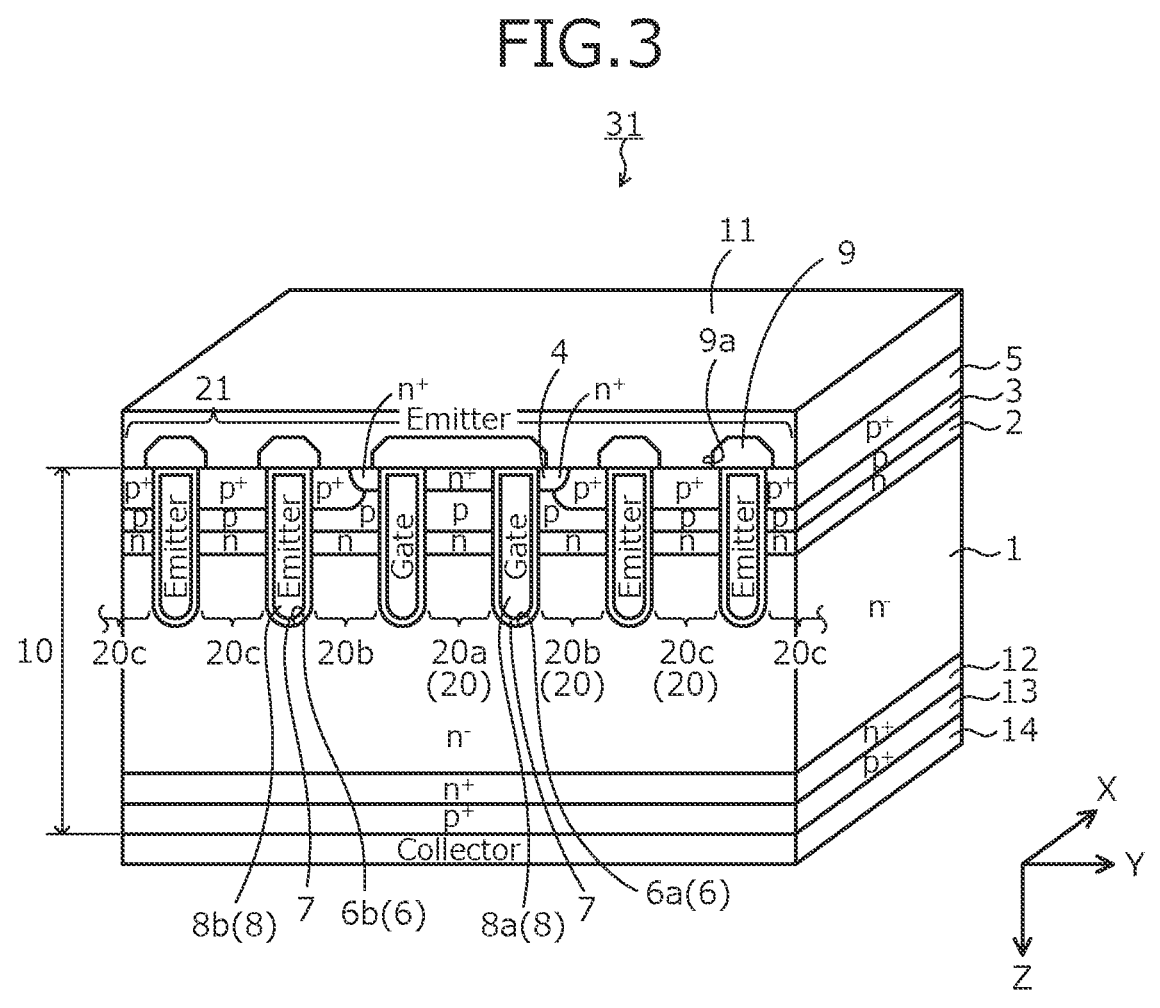
Figure 4:
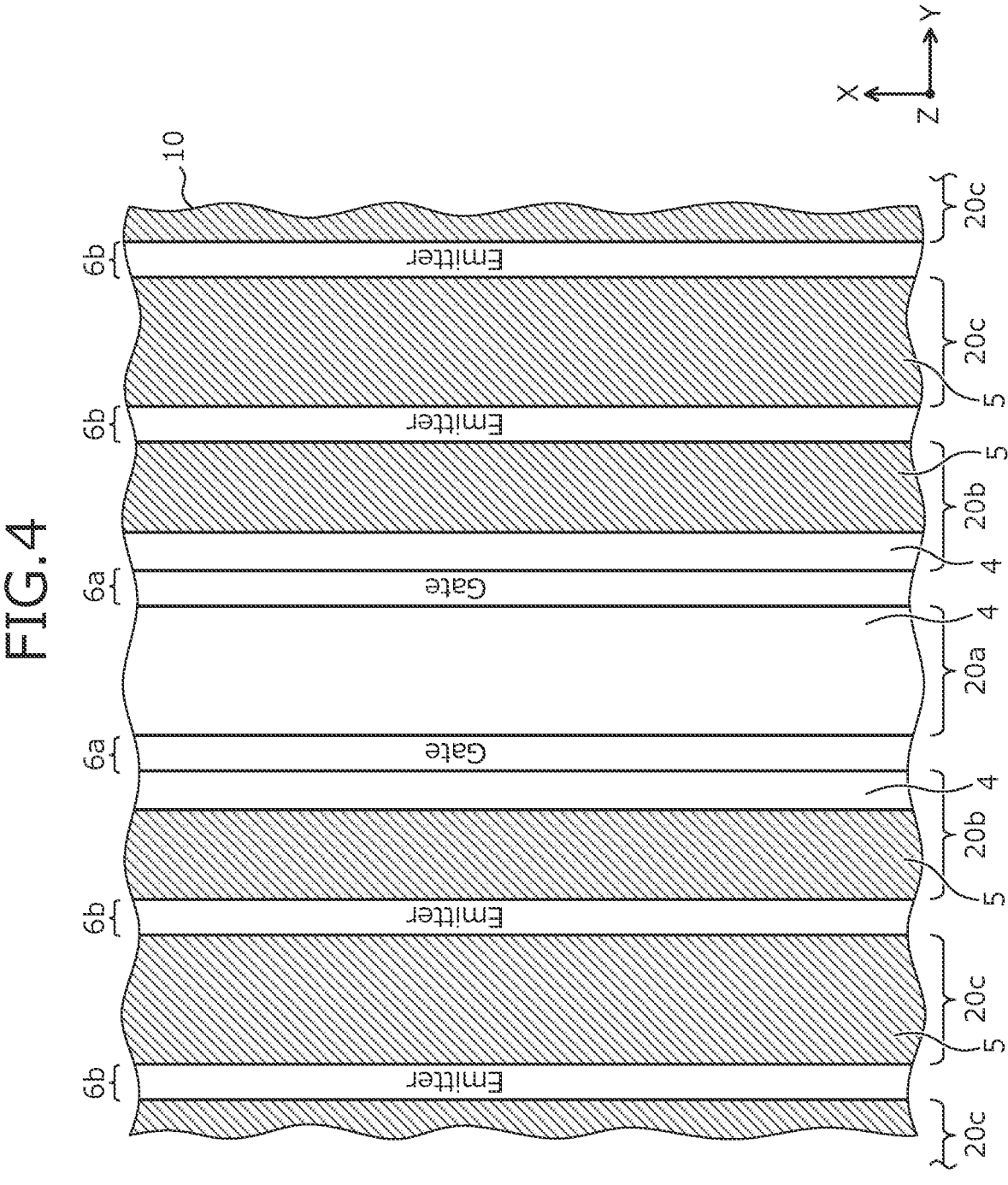
FIG. 4 is a plan view depicting another example of the layout when the semiconductor device in FIG. 3 is viewed from the front side of the semiconductor substrate.

A structure of a semiconductor device according to a first embodiment is described. FIG. 1 is a perspective view depicting the structure of the semiconductor device according to the first embodiment. FIG. 2 is a plan view depicting a layout when the semiconductor device in FIG. 1 is viewed from a front side of a semiconductor substrate. FIG. 3 is a perspective view depicting another example of the structure of the semiconductor device according to the first embodiment. FIG. 4 is a plan view depicting another example of the layout when the semiconductor device in FIG. 3 is viewed from the front side of the semiconductor substrate. FIGS. 2 and 4 depict the layout of n⁺-type emitter regions 4 and p⁺-type contact regions 5 in FIGS. 1 and 3. In FIGS. 2 and 4, the p⁺-type contact regions 5 are indicated by hatching and an insulating film 7 is not depicted.

A semiconductor device 31 according to the first embodiment depicted in FIGS. 1 and 2 is a trench gate IGBT that has, in a front side of a semiconductor substrate (semiconductor chip) 10, in an active region, multiple trenches 6 in which electrodes (first electrodes) 8 are embedded via the insulating film 7. The active region is a region through which a main current (collector-emitter current) flows when the IGBT in an ON state and in which a later-described base unit portion 21 is disposed. The active region, for example, in a plan view of the semiconductor device 31, has a substantially rectangular shape (not depicted) and is disposed in a center of the semiconductor substrate. A periphery of the active region is surrounded by an edge termination region (not depicted).

The edge termination region is a region between the active region and an end of the semiconductor substrate 10 (chip end), a region that mitigates electric field of the front side of the semiconductor substrate 10 and maintains a breakdown voltage (withstand voltage). The breakdown voltage is voltage limit at which no malfunction or destruction of a device element occurs. In the edge termination region, a voltage withstanding structure such as a field limiting ring (FLR), a mesa structure, a junction termination extension (JTE) structure, a field plate, etc. is disposed.

The trenches 6 are disposed in a striped pattern that extends in the first direction X (longitudinal direction) that is parallel to the front surface of the semiconductor substrate 10 (refer to FIG. 2). All the trenches 6 have substantially a same width (width in a second direction Y) and are disposed at equal intervals in the second direction Y (transverse direction), which is parallel to the front surface of the semiconductor substrate 10 and orthogonal to the first direction X. Substantially the same width means a same width in a range that includes an allowable error due to manufacturing process variation. In particular, for the trenches 6, the allowable error due to manufacturing process variation is about ±10% of the design value.

In an instance in which the trenches 6 are not disposed at equal intervals, the breakdown voltage of the entire semiconductor device 31 (the entire semiconductor substrate 10) decreases and is rate limited by a breakdown voltage that is determined by relatively wider intervals among the intervals between the trenches 6 that are adjacent to one another. The trenches 6 are disposed at equal intervals, whereby a substantially uniform electric field is applied to all the trenches 6 and the electric field strength of the bottoms of the trenches 6 may be reduced and thus, the breakdown voltage of the overall semiconductor device 31 may be enhanced. The narrower is the interval between the trenches 6 that are adjacent to one another, the smaller is the electric field strength at the bottoms of the trenches 6 and thus, a high breakdown voltage becomes possible.

All the trenches 6, for example, extend from the active region to the edge termination region and terminate in the edge termination region. In the trenches 6, the insulating film 7 is provided along inner walls of the trenches 6 and the electrodes 8 are provided on the insulating film 7 so as to be embedded in the trenches 6. The electrodes 8 of a set of trenches (gate trenches) 6a of the trenches 6 are gate electrodes 8a of the IGBT (the semiconductor device 31) and have a gate potential, and at a non-depicted portion, are electrically connected to a gate pad (electrode pad, not depicted).

The electrodes 8 in the remaining trenches (dummy trenches) 6b of the trenches 6, excluding the gate trenches 6a, are dummy electrodes 8b of the IGBT (the semiconductor device 31) and have an emitter potential. All the dummy electrodes 8b are electrically connected to an emitter electrode (second electrode) 11 at a non-depicted portion (for example, ends of the gate trenches 6a in the longitudinal direction). The dummy electrodes 8b are provided, whereby a total gate charge amount may be suppressed from becoming excessively high.

In particular, for example, on the front surface of the semiconductor substrate 10, a gate runner (not depicted) is provided via a field oxide film. The gate electrodes 8a, at the ends of the gate trenches 6a, are coupled to the gate runner and via the gate runner, are electrically connected to the gate pad. The ends of the dummy trenches 6b, for example, terminate further on the active region side than does the gate runner. At the ends of the dummy trenches 6b, the dummy electrodes 8b and the emitter electrode 11 are directly connected or are electrically connected.

The base unit portion 21, which includes two of the gate trenches 6a and the dummy trenches 6b of a quantity (number) that is "n" times the quantity of the gate trenches 6a (where, "n" is a natural number at least equal to 2), is provided in plural and in parallel in the second direction Y. The two of the gate trenches 6a in the base unit portion 21 are disposed adjacent to each other. While arrangement of the dummy trenches 6b in the base unit portion 21 may be suitably set, the gate trenches 6a and the dummy trenches 6b may be disposed regularly spanning the entire semiconductor substrate 10 or may be disposed in a same order in all the base unit portions 21.

For example, in the second direction Y, for every two of the gate trenches 6a disposed, the dummy trenches 6b of a quantity (2×n) are disposed, whereby the base unit portion 21 that includes the two of the gate trenches 6a and the dummy trenches 6b of the quantity (2×n) is disposed in plural and in parallel in the second direction Y. FIGS. 1 and 2 depict the base unit portion 21 that includes two of the gate trenches 6a and four (4) (where, n=2) of the dummy trenches 6b. Further, the gate electrodes 8a are indicated as "Gate" and the dummy electrodes 8b are indicated as "Emitter" (similarly in FIGS. 3 to 8).

A ratio of the quantity of the gate trenches 6a to the quantity of the dummy trenches 6b in the base unit portion 21 is determined according to, for example, the total gate charge amount of the semiconductor device 31, the driving performance (current supply performance) of the driving circuit that supplies the gate current (driving current) to the semiconductor device 31, etc. The total gate charge amount of the semiconductor device 31 is the amount of charge necessary to charge the gate electrodes 8a to turn-on the semiconductor device 31 (input capacitance: sum of gate-emitter capacitance and gate-collector capacitance).

Surface regions of the front surface of the semiconductor substrate 10 are separated by the trenches 6 and a protrusion is formed by each portion (mesa portion) 20 between each adjacent two of the trenches 6. The mesa portions 20 include first mesa portions 20a each of which is between a respective adjacent two of the gate trenches 6a, second mesa portions 20b each of which is between a respective one of the gate trenches 6a and an adjacent one of the dummy trenches 6b, and third mesa portions 20c each of which is between a respective adjacent two of the dummy trenches 6b, all having a same cell structure.

Between two of the second mesa portions 20b, at least one of the first mesa portions 20a is disposed. Between one of the first mesa portions 20a and one of the third mesa portions 20c, at least one of the second mesa portions 20b is disposed. Between two of the second mesa portions 20b, at least one of the third mesa portions 20c is disposed. In other words, the first mesa portions 20a and the third mesa portions 20c are disposed so as to be alternately sandwiched between the second mesa portions 20b. The third mesa portions between the second mesa portions 20b may be disposed in a greater quantity (for example, 3) than a quantity of the first mesa portions 20a between the second mesa portions 20b.

In all the mesa portions 20 (20a, 20b, 20c), n-type storage regions 2, p-type base regions 3, the n⁺-type emitter regions 4, and the p⁺-type contact regions 5 are each selectively provided. The n-type storage regions 2, the p-type base regions (second semiconductor region) 3, the n⁺-type emitter regions (third semiconductor region) 4, the p⁺-type contact regions 5, a later-described n⁺-type buffer region 12, and a p⁺-type collector region (fourth semiconductor region) 13, for example, are diffused regions formed by ion implantation to the semiconductor substrate 10 that contains silicon (Si).

A portion of the n⁻-type semiconductor substrate 10, excluding the n-type storage regions 2, the p-type base regions 3, the n⁺-type emitter regions 4, the p⁺-type contact regions 5, the n⁺-type buffer region 12, and the p⁺-type collector region 13 constitutes an n⁻-type drift region (first semiconductor region) 1. The n⁻-type drift region 1 reaches the end of the semiconductor substrate 10, from the active region. The p-type base regions 3 are provided between the front surface of the semiconductor substrate 10 and the n⁻-type drift region 1. The n-type storage regions 2 are provided between and in contact with the p-type base regions 3 and the n⁻-type drift region 1.

The n-type storage regions 2 is a barrier of minority carriers (holes) during turn-on of the IGBT and have a function as a carrier storage (CS) region that stores minority carriers close to a border between the n⁻-type drift region 1 and the n-type storage regions 2. During turn-on of the IGBT, minority carriers accumulate closer to the n-type storage regions 2, whereby an IE effect increases and conduction loss decreases. The n-type storage regions 2 may be omitted. In an instance in which the n-type storage regions 2 is omitted, the p-type base regions 3 and the n⁻-type drift region 1 are in contact with each other.

The n⁻-type drift region 1, the n-type storage regions 2, and the p-type base regions 3 each extend in the first direction X in the mesa portions 20. In the mesa portions 20, the n⁻-type drift region 1, the n-type storage regions 2, and the p-type base regions 3 reach both sidewalls of the trenches 6 (the gate trenches 6a in portions adjacent to the gate trenches 6a, the dummy trenches 6b in portions adjacent to the dummy trenches 6b) in the second direction Y, and are in contact with the insulating film 7 at the sidewalls of the trenches 6. Below the trenches 6, closer to the n⁺-type buffer region 12 than are the trenches 6, the n⁻-type drift region 1 is a single continuous region.

In the mesa portions 20, the n⁺-type emitter regions 4 and the p⁺-type contact regions 5 are selectively provided between the front surface of the semiconductor substrate 10 and the p-type base regions 3 so as to be in contact with the p-type base regions 3. In the mesa portions 20, the n⁺-type emitter regions 4 and the p⁺-type contact regions 5 are adjacent to one another and disposed to repeatedly alternate with one another in the first direction X (FIG. 2). An interval at which the p⁺-type contact regions 5 are spaced in the first direction X may be wider or narrower than a width of the p⁺-type contact regions 5 in the first direction X.

The n⁺-type emitter regions 4 of any adjacent two of the mesa portions 20 are adjacent to each other in the second direction Y. In other words, the n⁺-type emitter regions 4 and the p⁺-type contact regions 5 extend in a striped pattern in the second direction Y and sandwich the trenches 6; in the mesa portions 20, the n⁺-type emitter regions 4 and the p⁺-type contact regions 5 reach both sidewalls of the trenches 6 in the second direction Y (the gate trenches 6a in portions adjacent to the gate trenches 6a, the dummy trenches 6b in portions adjacent to the dummy trenches 6b), and are in contact with the insulating film 7 at the sidewalls of the trenches 6.

The trenches 6 (the gate trenches 6a, the dummy trenches 6b) penetrate through the n⁺-type emitter regions 4, the p⁺-type contact regions 5, the p-type base regions 3, and the n-type storage regions 2, in the depth direction Z, from the front surface of the semiconductor substrate 10 and terminate in the n⁻-type drift region 1. All the trenches 6 are at substantially a same depth. A substantially same depth means a same depth in a range that includes an allowable error due to manufacturing process variation. A channel (n-type inversion layer) is formed only in portions of the p-type base regions 3, the portions that are along the gate trenches 6a, in the second mesa portions 20b.

On the front surface of the semiconductor substrate 10, an interlayer insulating film 9 is provided. The interlayer insulating film 9 covers the first mesa portions 20a, the gate electrodes 8a, and the dummy electrodes 8b. The gate electrodes 8a are electrically insulated from the emitter electrode 11 by the interlayer insulating film 9. The first mesa portions 20a are electrically insulated from the emitter electrode 11 by the interlayer insulating film 9 and are electrically floating. Therefore, the p-type base regions 3, the $n^+$-type emitter regions 4, and the $p^+$-type contact regions 5 of the first mesa portions 20a are electrically floating.

The second and third mesa portions 20b, 20c are exposed in respectively different contact holes 9a of the interlayer insulating film 9. The second and third mesa portions 20b, 20c, via the contact holes 9a of the interlayer insulating film 9, are in contact with the emitter electrode 11 and fixed to the potential (emitter potential) of the emitter electrode 11. Therefore, the p-type base regions 3, the $n^+$-type emitter regions 4, and the $p^+$-type contact regions 5 of the second mesa portions 20b, and the p-type base regions 3, the $n^+$-type emitter regions 4, and the $p^+$-type contact regions 5 of the third mesa portions 20c are fixed to the emitter potential.

The first mesa portions 20a are electrically floating, whereby after turn-on of the IGBT (the semiconductor device 31), the potential of the first mesa portions 20a decreases temporally from a high potential (for example, about 20V) directly after turn-on of the IGBT and changes to a potential close to an emitter potential (for example, ground potential) that is ultimately the lowest potential. Variation of the potential of the first mesa portions 20a requires a large amount of charge and therefore, the gate-collector capacitance appears to increase. As a result, the dV/dt (reverse recovery dV/dt) of the anode-cathode voltage may be decreased during reverse recovery of the diode connected in antiparallel to the IGBT.

In an instance in which the reverse recovery dV/dt is maintained at about the same as that of the conventional structure (refer to FIGS. 10 and 11), the gate resistance may be reduced and thus, the turn-on loss Eon may be reduced. For example, when used as a device for an inverter, the diode connected in antiparallel to the IGBT is a freewheeling diode (FWD) for commutating load current when, by switching operation of the bridge-connected IGBT, dielectric load of, for example, a motor is controlled. The diode connected in antiparallel to the IGBT may be an external component (not depicted) or may be built into the semiconductor substrate 10 (refer to FIGS. 7 and 8).

The emitter electrode 11 is in ohmic contact with the $n^+$-type emitter regions 4 and the $p^+$-type contact regions 5 in the second and third mesa portions 20b, 20c. The emitter electrode 11 is electrically connected to the p-type base regions 3 of the second and third mesa portions 20b, 20c via the $p^+$-type contact regions 5. Lower surfaces of the $n^+$-type emitter regions 4 form pn junctions with an upper surface of the p-type base regions 3. The $p^+$-type contact regions 5 may be omitted. In an instance in which the $p^+$-type contact regions 5 are omitted, the emitter electrode 11, in the second and third mesa portions 20b, 20c, is in contact with the p-type base regions 3 instead of the $p^+$-type contact regions 5.

The emitter electrode 11 covers substantially the entire surface of the active region. Further, on the front surface of the semiconductor substrate 10, the gate pad and the gate runner are provided apart from the emitter electrode 11. All the gate electrodes 8a are electrically connected to the gate pad via the gate runner. The gate runner is provided in the edge termination region and surrounds the periphery of the active region. An uppermost layer of the front surface of the semiconductor substrate 10 is a passivation film. In the emitter electrode 11, a portion thereof exposed in an opening of the passivation film constitutes an emitter pad (electrode pad).

Between a back surface of the semiconductor substrate 10 and the $n^-$-type drift region 1, the $n^+$-type buffer region 12 and the $p^+$-type collector region 13 are provided. The $n^+$-type buffer region 12 and the $p^+$-type collector region 13 reach the end of the semiconductor substrate 10 from the active region. The $p^+$-type collector region 13 is provided between the back surface of the semiconductor substrate 10 and the $n^-$-type drift region 1. The $n^+$-type buffer region 12 is provided between and in contact with the $p^+$-type collector region 13 and the $n^-$-type drift region 1.

The $n^+$-type buffer region 12 has a function of preventing electric field from reaching the $p^+$-type collector region 13, the electric field being generated in the $n^-$-type drift region 1 when the IGBT is OFF. The $n^+$-type buffer region 12 may be omitted. In an instance in which the $n^+$-type buffer region 12 is omitted, the $p^+$-type collector region 13 and the $n^-$-type drift region 1 are in contact with each other. A collector electrode (third electrode) 14 is provided on the entire back surface of the semiconductor substrate 10. The collector electrode 14 is in ohmic contact with the $p^+$-type collector region 13.

As depicted in FIGS. 3 and 4, the mesa portions 20 may have different cell structures in the first to third mesa portions 20a to 20c, respectively. In this case, for example, the layout when the $n^+$-type emitter regions 4 and the $p^+$-type contact regions 5 are viewed from the front surface of the semiconductor substrate 10 is different in the first to third mesa portions 20a to 20c. In particular, in the first mesa portions 20a, the n-type storage regions 2, the p-type base regions 3, and the $n^+$-type emitter regions 4 are each selectively provided. While not depicted in FIGS. 3 and 4, the $p^+$-type contact regions 5 may be provided in the first mesa portions 20a.

In the second mesa portions 20b, the n-type storage regions 2, the p-type base regions 3, the $n^+$-type emitter regions 4, and the $p^+$-type contact regions 5 are each selectively provided. In the third mesa portions 20c, the n-type storage regions 2, the p-type base regions 3, and the $p^+$-type contact regions 5 are each selectively provided. The third mesa portions 20c that are not adjacent to the gate trenches 6a are free of the $n^+$-type emitter regions 4. The $n^-$-type drift region 1, the n-type storage regions 2, and the p-type base regions 3 each extend linearly in the first direction X in all the mesa portions 20, similarly to the cell structures depicted in FIGS. 1 and 2.

More specifically, in an instance in which the first to third mesa portions 20a to 20c respectively have different cell structures, in the first mesa portions 20a, the $n^+$-type emitter regions 4 are provided in an entire area between the front surface of the semiconductor substrate 10 and the p-type base regions 3 and are in contact with the insulating film 7, at both sidewalls of the gate trenches 6a (refer to FIG. 4). In an instance in which the $p^+$-type contact regions 5 are provided in the first mesa portions 20a, the $p^+$-type contact regions 5 may be scattered in the first direction X or may extend linearly in the first direction X (not depicted).

In the second mesa portions 20b, the $n^+$-type emitter regions 4 are adjacent to the gate trenches 6a, are in contact with the insulating film 7 at the sidewalls of the gate trenches 6a, and extend linearly in the first direction X along the gate trenches $6a$. Between the dummy trenches $6b$ and the $n^+$-type emitter regions 4, the $p^+$-type contact regions 5 are in contact with the insulating film 7 at the sidewalls of the dummy trenches $6b$ and extend linearly in the first direction X along the dummy trenches $6b$. In the third mesa portions $20c$, the $p^+$-type contact regions 5 are provided between the front surface of the semiconductor substrate 10 and the p-type base regions 3 and are in contact with the insulating film 7, at both sidewalls of the dummy trenches $6b$ (refer to FIG. 4).

The gate trenches $6a$ penetrate through the $n^+$-type emitter regions 4, the p-type base regions 3, and the n-type storage regions 2, in the depth direction Z, from the front surface of the semiconductor substrate 10 and terminate in the $n^-$-type drift region 1. The dummy trenches $6b$ penetrate through the $p^+$-type contact regions 5, the p-type base regions 3, and the n-type storage regions 2, in the depth direction Z, from the front surface of the semiconductor substrate 10 and terminate in the $n^-$-type drift region 1. The emitter electrode 11 is in ohmic contact with the $n^+$-type emitter regions 4 and the $p^+$-type contact regions 5 in the second mesa portions $20b$ and is in ohmic contact with the $p^+$-type contact regions 5 in the third mesa portions $20c$.

Operation of the semiconductor device 31 according to the first embodiment is described. When voltage that is at least equal to a gate threshold is applied to the gate electrodes $8a$ while voltage (forward voltage) that is positive with respect to the emitter electrode 11 is applied to the collector electrode 14, a channel (n-type inversion layer) is formed only in portions of the p-type base regions 3, the portions that are along the gate trenches $6a$, in the second mesa portions $20b$. As a result, pn junctions between the $p^+$-type collector region 13 and the $n^+$-type buffer region 12 are forward biased and the IGBT (the semiconductor device 31) turns ON.

When the IGBT turns ON, holes are injected into the $n^-$-type drift region 1 from the $p^+$-type collector region 13, via the $n^+$-type buffer region 12, whereby electrons are injected into the $n^-$-type drift region 1 from the $n^+$-type emitter regions 4, via the channel and the n-type storage regions 2, carrier concentration of the $n^-$-type drift region 1 increases, and conductivity modulation occurs. Due to the conductivity modulation, the resistance value of the $n^-$-type drift region 1 decreases and voltage drops in the forward direction are suppressed and thus, the IGBT becomes a switching device that turns ON by a low ON voltage.

As described above, according to the first embodiment, in a trench gate IGBT, some of the trenches disposed at equal intervals in a front side of the semiconductor substrate are the gate trenches that are embedded with the gate electrodes and the remaining trenches are the dummy trenches that are embedded with dummy electrodes of the emitter potential. The base unit portion in which the trenches (the gate trenches and the dummy trenches) are repeatedly disposed includes an adjacent two of the gate trenches, the adjacent two being disposed adjacent to each other. The first mesa portion that is between the adjacent two of the gate trenches is electrically floating.

The first mesa portion that is between the adjacent two of the gate trenches is electrically floating, whereby the gate-collector capacitance increases and thus, the reverse recovery dV/dt may be reduced. Further, in an instance in which the reverse recovery dV/dt is maintained, the gate resistance is reduced and dI/dt (rate of current change per unit time) of the collector-emitter current may be increased and the turn-on loss Eon may be suppressed. Thus, the tradeoff relationship between the turn-on loss Eon and the reverse recovery dV/dt may be improved.

Figure 5:
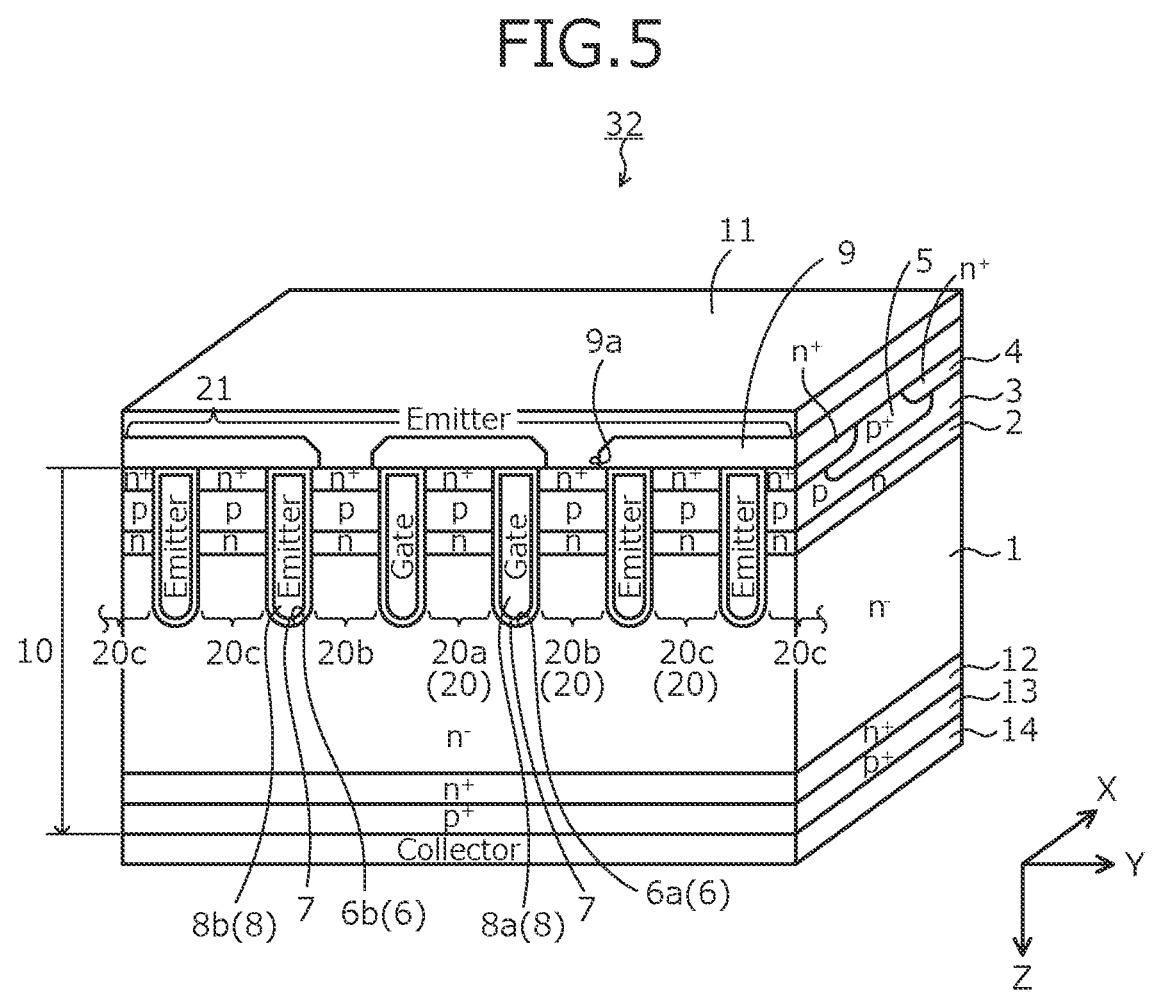

Next, a structure of a semiconductor device according to a second embodiment is described. FIG. 5 is a perspective view depicting the structure of the semiconductor device according to the second embodiment. A semiconductor device 32 according to the second embodiment depicted in FIG. 5 differs from the semiconductor device 31 according to the first embodiment (refer to FIGS. 1 and 2) in that the third mesa portions $20c$ between the dummy trenches $6b$ that are adjacent to one another are covered by the interlayer insulating film 9 and are electrically floating.

In other words, in the second embodiment, the first mesa portions $20a$ that are between the gate trenches $6a$ that are adjacent to one another, and the third mesa portions $20c$ that are between the dummy trenches $6b$ that are adjacent to one another are covered by the interlayer insulating film 9, are electrically connected to the emitter electrode 11, and are electrically floating. The second mesa portions $20b$ that are each between a respective one of the gate trenches $6a$ and one of the dummy trenches $6b$ adjacent thereto, similarly to the first embodiment, are fixed to the potential of the emitter electrode 11.

Of the multiple third mesa portions $20c$ in the base unit portion 21, some of the third mesa portions $20c$ may be electrically floating, or all the third mesa portions $20c$ may be electrically floating. In all the base unit portions 21, the gate trenches $6a$ and the dummy trenches $6b$ are assumed to have the same arrangement and in all the base unit portions 21, the third mesa portions $20c$ of the same corresponding positions suffice to be electrically floating.

In the semiconductor device 32 according to the second embodiment, for example, the cell structures in FIGS. 3 and 4 are applied and the cell structures may be respectively different in the first to third mesa portions $20a$ to $20c$.

As described above, according to the second embodiment, the first mesa portions that are between adjacent gate trenches are electrically floating and thus, have an effect similar to that of the first embodiment. Further, according to the second embodiment, the third mesa portions that are between adjacent dummy trenches are electrically floating, whereby the ON voltage and conduction loss (loss when collector-emitter current is flowing) may be reduced. The greater is the quantity of the third mesa portions that are electrically floating, the lower the ON voltage may be reduced.

Figure 6:
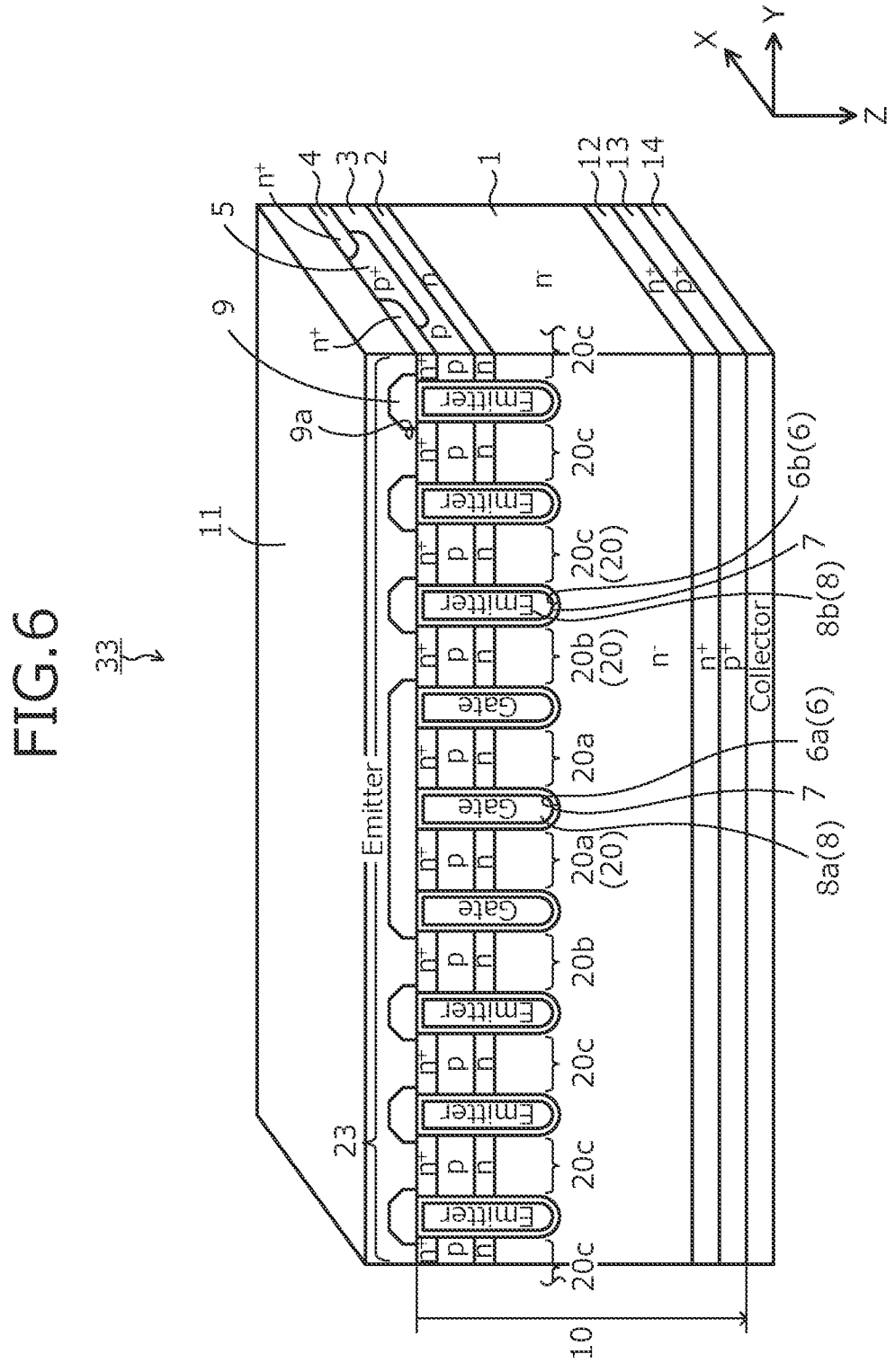
FIG. 6 is a perspective view depicting the structure of a semiconductor device according to a third embodiment.

Next, a structure of a semiconductor device according to a third embodiment is described. FIG. 6 is a perspective view depicting the structure of the semiconductor device according to the third embodiment. A semiconductor device 33 according to the third embodiment depicted in FIG. 6 differs from the semiconductor device 31 according to the first embodiment (refer to FIGS. 1 and 2) in that a base unit portion 23 in which the trenches 6 are repeatedly disposed includes at least three of the gate trenches $6a$, all of these gate trenches $6a$ are disposed adjacently to one another in the second direction Y and at least two of the first mesa portions $20a$ are adjacent to each other in the second direction Y.

In particular, in the third embodiment, the base unit portion 23, which includes "m" (where, "m" is a natural number at least equal to 3) of the gate trenches $6a$ and (m×n) (where, "n" is a natural number at least equal to 2) of the dummy trenches $6b$, is disposed in plural and in parallel in the second direction Y. All the gate trenches $6a$ in the base unit portion 23 are disposed adjacent to one another. While arrangement of the dummy trenches 6b in the base unit portion 23 may be suitably set, preferably, the gate trenches 6a and the dummy trenches 6b may be disposed in the same sequence in all the base unit portions 23.

For example, in the second direction Y, for every "m" of the gate trenches 6a, (m×n) of the dummy trenches 6b are disposed, thus, the base unit portion 23, which includes the "m" of the gate trenches 6a and the (m×n) of the dummy trenches 6b, is disposed in plural and in parallel in the second direction Y. In FIG. 6, the base unit portion 23, which includes three (m=3) of the gate trenches 6a and six (n=2) of the dummy trenches 6b, is depicted. The greater is the quantity ("m") of the gate trenches 6a that are disposed adjacent to one another in the second direction Y, the greater is the effect of reducing the turn-on loss Eon.

All the first mesa portions 20a between the adjacent gate trenches 6a, similarly to the first embodiment, are covered by the interlayer insulating film 9, are electrically connected to the emitter electrode 11, and are electrically floating. The second mesa portions 20b each between a respective one of the gate trenches 6a and one of the dummy trenches 6b adjacent thereto, and the third mesa portions 20c between the adjacent dummy trenches 6b, similarly to the first embodiment, are connected to the emitter electrode 11 via contact holes 9a of the interlayer insulating film 9 and are fixed to the potential of the emitter electrode 11.

At least two of the first mesa portions 20a are disposed between two of the second mesa portions 20b. The third mesa portions 20c are disposed between two of the second mesa portions 20b. The quantity of the third mesa portions 20c between the second mesa portions 20b may be a quantity (for example, at least 4) greater than the quantity of the first mesa portions 20a between the second mesa portions 20b. Configurations of the first to third mesa portions 20a to 20c of the third embodiment are, respectively, the same as those of the first to third mesa portions 20a to 20c in FIG. 3.

In the semiconductor device 33 according to the third embodiment, for example, the cell structures in FIGS. 3 and 4 are applied and the cell structures may be respectively different in the first to third mesa portions 20a to 20c.

In the semiconductor device 33 according to the third embodiment, the second embodiment (refer to FIG. 5) may be applied, and the third mesa portions 20c may be covered by the interlayer insulating film 9 and, thereby, may be electrically floating.

As described above, according to the third embodiment, the quantity of the gate trenches disposed adjacently to one another in the second direction is increased, whereby an effect of the first embodiment may be increased.

Figure 7:
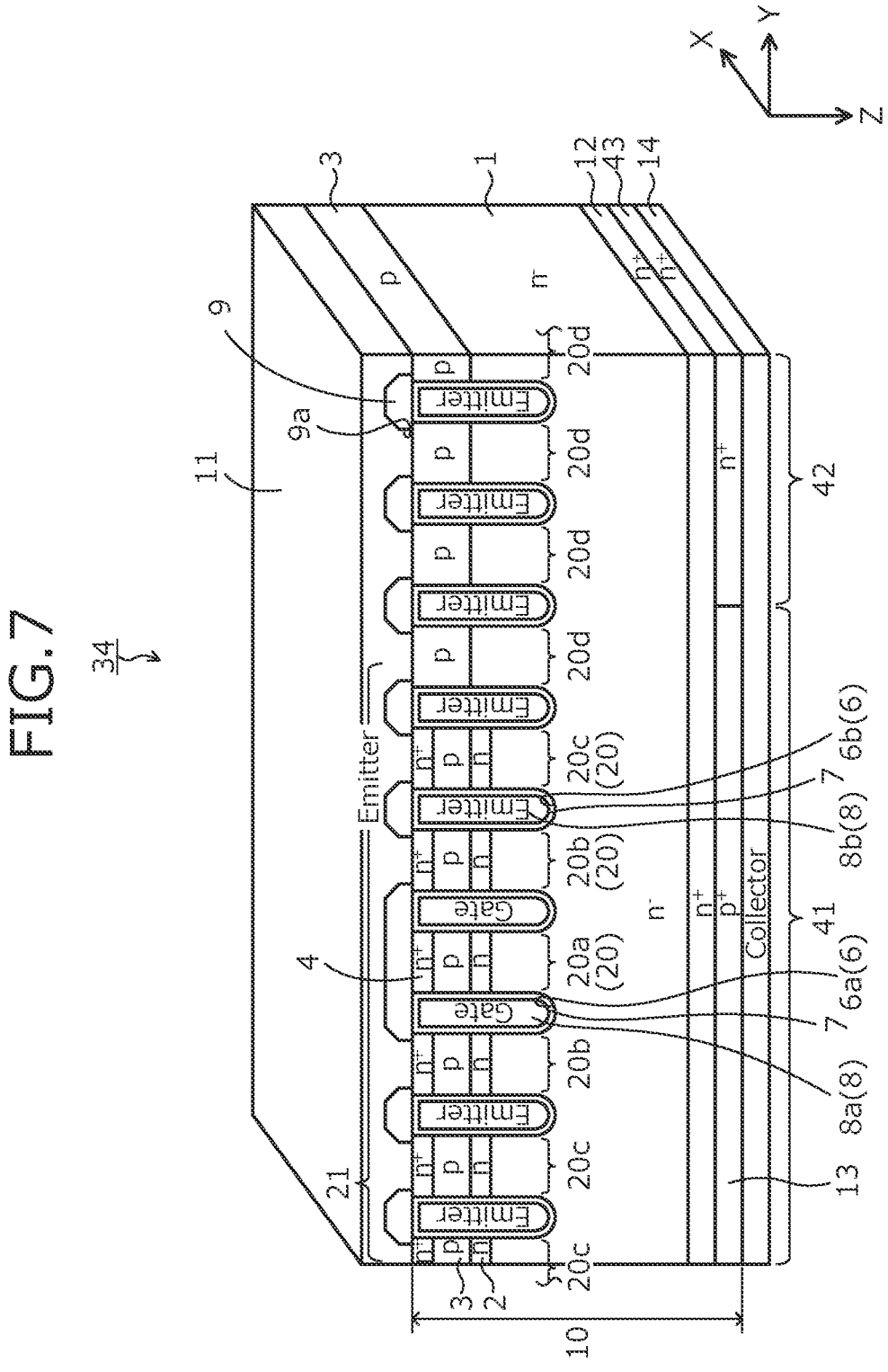
FIG. 7 is a perspective view depicting the structure of a semiconductor device according to a fourth embodiment.

Next, a structure of a semiconductor device according to a fourth embodiment is described. FIG. 7 is a perspective view depicting the structure of the semiconductor device according to the fourth embodiment. The semiconductor device 34 according to the fourth embodiment depicted in FIG. 7 is a reverse conducting IGBT (RC-IGBT) in which a diode is built into the semiconductor device 31 according to the first embodiment (refer to FIGS. 1 and 2).

In particular, in the fourth embodiment, in the active region of the semiconductor substrate 10, an IGBT portion (first device region) 41 and a diode portion (second device region) 42 are disposed adjacent to each other in the second direction. The IGBT is disposed in the IGBT portion 41. Configuration of the IGBT of the IGBT portion 41 is the same as that of the semiconductor device 31 according to the first embodiment. Of the trenches 6 in the IGBT portion 41, one or more (preferably, may be two or more) closest to the diode portion 42 are the dummy trenches 6b.

In the IGBT portion 41, the trenches 6 closest to the diode portion 42 are the dummy trenches 6b and by increasing the distance that the gate trenches 6a are from the diode portion 42, mutual interference between the IGBT of the IGBT portion 41 and the diode of the diode portion 42 may be suppressed. In the IGBT portion 41, the trench 6 closest to the diode portion 42 may be positioned at a border between the IGBT portion 41 and the diode portion 42 (border between the $p^+$-type collector region 13 and a later-described $n^+$-type cathode region 43).

In the diode portion 42, the diode is disposed connected in antiparallel to the IGBT of the IGBT portion 41. The diode of the diode portion 42, for example, functions as a FWD for commutating load current when the IGBT of the IGBT portion 41 is used as a device for an inverter. The trenches 6 are disposed in the diode portion 42 as well, similarly to the IGBT portion 41. All the trenches 6 of the diode portion 42 are the dummy trenches 6b.

Similarly to the dummy trenches 6b of the IGBT portion 41, the dummy electrodes 8b are provided in the dummy trenches 6b of the diode portion 42, via the insulating film 7. In the diode portion 42, fourth mesa portions 20d are between the dummy trenches 6b that are adjacent to each other and in an entire area of each of the fourth mesa portions 20d, only the p-type base regions 3 are provided. The p-type base regions 3 in the fourth mesa portions 20d function as anode regions.

The fourth mesa portions 20d are free of the n-type storage regions 2 and the $n^+$-type emitter regions 4. While not depicted, in the fourth mesa portions 20d, the $p^+$-type contact regions 5 may be provided in an entire area between the front surface of the semiconductor substrate 10 and the p-type base regions 3. The fourth mesa portions 20d are in contact with the emitter electrode 11 via contact holes 9a in the interlayer insulating film 9 and are fixed to the potential of the emitter electrode 11.

The emitter electrode 11, in the fourth mesa portions 20d, is in contact with and electrically connected to the p-type base regions 3. In an instance in which the $p^+$-type contact regions 5 are provided in the fourth mesa portions 20d, in the fourth mesa portions 20d, the emitter electrode 11 is in ohmic contact with the $p^+$-type contact regions 5 and is electrically connected to the p-type base regions 3, via the $p^+$-type contact regions 5. The emitter electrode 11 further serves as an anode electrode of the diode portion 42.

In the back side of the semiconductor substrate 10, in the diode portion 42, the $n^+$-type cathode region (fifth semiconductor region) 43 is provided in an entire area between the back surface of the semiconductor substrate 10 and the $n^+$-type buffer region 12. The $n^+$-type cathode region 43 is a diffused region formed by ion implantation to the semiconductor substrate 10. An impurity concentration of the $n^+$-type cathode region 43 may be higher than an impurity concentration of the $n^+$-type buffer region.

The $n^+$-type cathode region 43 is adjacent to the $p^+$-type collector region 13 of the IGBT portion 41, in the second direction Y. The collector electrode 14 is in ohmic contact with the $p^+$-type collector region 13 in the IGBT portion 41 and is in ohmic contact with the $n^+$-type cathode region 43 in the diode portion 42. The collector electrode 14 further serves as a cathode electrode of the diode portion 42.

In the semiconductor device 34 according to the fourth embodiment, for example, the cell structures in FIGS. 3 and 4 are applied and the cell structures may respectively different in the first to third mesa portions 20a to 20c.

In the semiconductor device 34 according to the fourth embodiment, the third embodiment (refer to FIG. 6) may be applied, and the IGBT of the IGBT portion 41 may be the semiconductor device 33 according to the third embodiment.

As described above, according to the fourth embodiment, even in an instance of the RC-IGBT in which a diode is built into the semiconductor device according to the first embodiment, the IGBT configuring the RC-IGBT may obtain an effect similar to that of the first embodiment.

Figure 8:
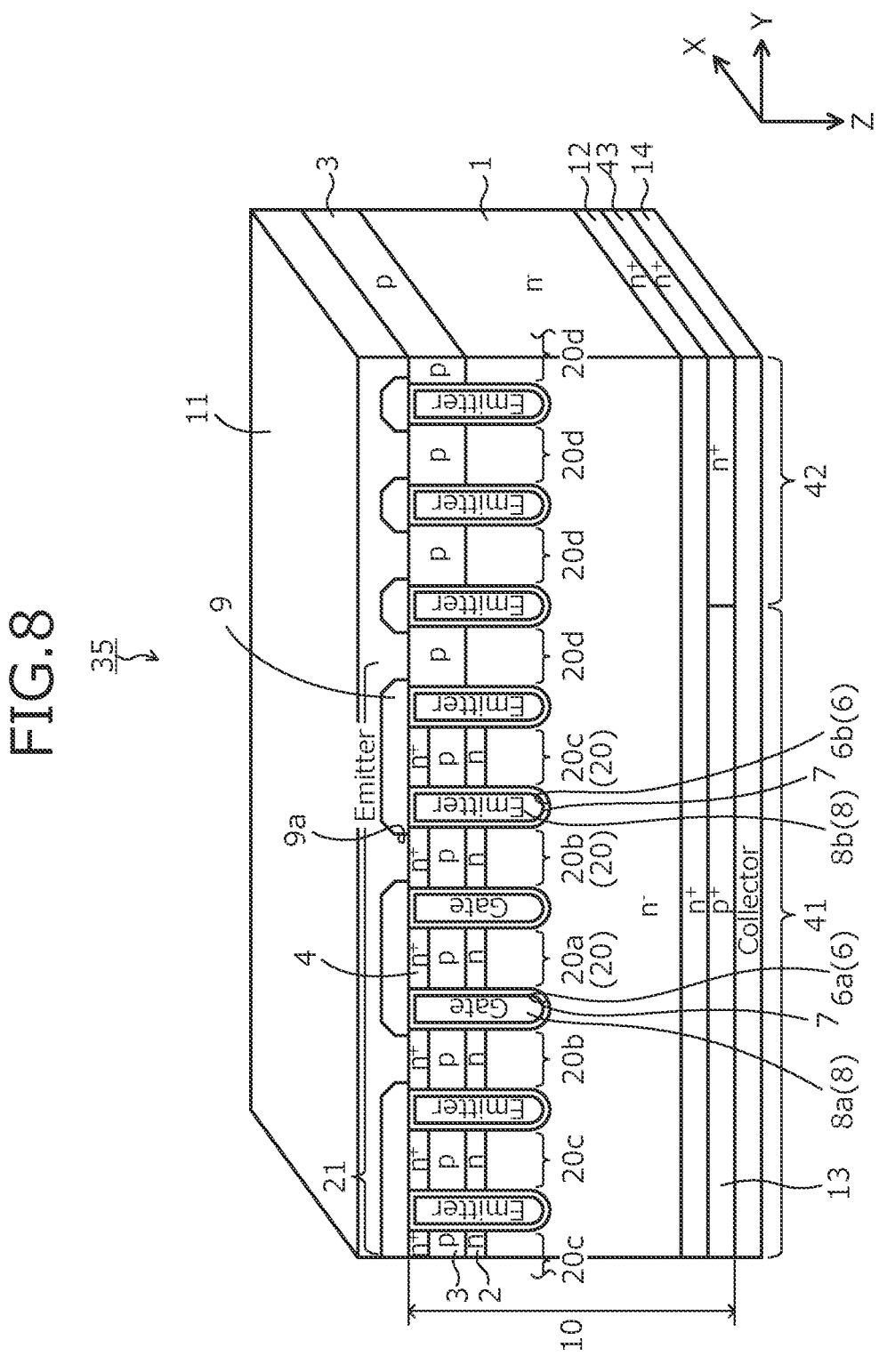
FIG. 8 is a perspective view depicting of the structure of a semiconductor device according to a fifth embodiment.

Next, a structure of a semiconductor device according to a fifth embodiment is described. FIG. 8 is a perspective view depicting of the structure of the semiconductor device according to the fifth embodiment. In a semiconductor device 35 according to the fifth embodiment depicted in FIG. 8, the second embodiment (refer to FIG. 5) is applied to the semiconductor device 34 according to the fourth embodiment (refer to FIG. 7), and the third mesa portions 20c between the adjacent dummy trenches 6b of the IGBT portion 41 are covered by the interlayer insulating film 9 and are electrically floating.

As described above, according to the fifth embodiment, the first mesa portions between the adjacent gate trenches and the third mesa portions between the adjacent dummy trenches are electrically floating and thus, effects similar to those of the first, third, and fourth embodiments as well as effects similar to those of the second embodiment are obtained.

Figure 9:
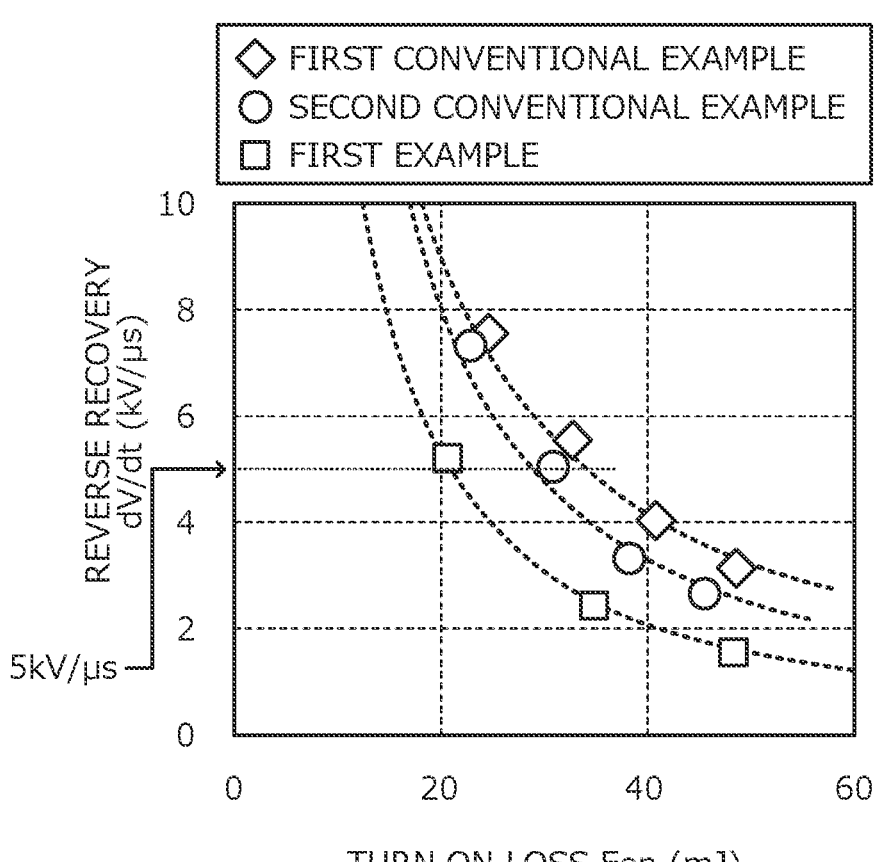
FIG. 9 is a characteristics diagram depicting a tradeoff relationship between turn-on loss Eon and reverse recovery dV/dt of an example.

The tradeoff relationship between the turn-on loss Eon and the reverse recovery dV/dt of the semiconductor device 31 according to the first embodiment described above (hereinafter, "example", refer to FIGS. 1 to 3) was verified. FIG. 9 is a characteristics diagram depicting the tradeoff relationship between the turn-on loss Eon and the reverse recovery dV/dt of the example. Results of measurement of the tradeoff relationships between of the turn-on loss Eon and the reverse recovery dV/dt for the example and first and second conventional examples are depicted in FIG. 9. The first and second conventional examples are the conventional semiconductor devices 131, 132 described above (refer to FIGS. 10 and 11).

The first conventional example differs from the example in that the arrangement of the gate trenches 106a and the dummy trenches 106b is different and the first conventional example is free of the first mesa portions between the adjacent gate trenches 106a. The second conventional example differs from the example in that the first mesa portions 120a between the adjacent gate trenches 106a are fixed to the potential (emitter potential) of the emitter electrode 111. In the first and second conventional examples, in the ON state, the potential of all the mesa portions 120 is an emitter potential (for example, ground potential), which is always the lowest potential, and does not fluctuate.

From the results depicted in FIG. 9, it was confirmed that the example could improve the tradeoff relationship between the turn-on loss Eon and the reverse recovery dV/dt as compared to the first and second conventional examples. In other words, in FIG. 9, as a tradeoff curve of the turn-on loss Eon and the reverse recovery dV/dt moves diagonally to the left and downward (the turn-on loss Eon approaches 0 kV/µs and the reverse recovery dV/dt approaches 0 mJ), the tradeoff between the turn-on loss Eon and the reverse recovery dV/dt improves.

When the reverse recovery dV/dt is, for example, 5 kV/µs and the example and the second conventional example are compared, it was found that the example reduced the turn-on loss Eon 40% as compared to the second conventional example in which the first mesa portions 120a between the adjacent gate trenches 106a are fixed to the potential of the emitter electrode 111. Thus, it was confirmed that similarly in the example, by making the first mesa portions 20a between the adjacent gate trenches 6a electrically float, the tradeoff between the turn-on loss Eon and the reverse recovery dV/dt improves.

While not depicted, the semiconductor device 32 according to the second embodiment (refer to FIG. 5) was also confirmed by the inventor to have a tradeoff curve for the turn-on loss Eon and the reverse recovery dV/dt, that was about the same as that of the example. While not depicted, in an instance in which, for example, the reverse recovery dV/dt is 5 kV/µs and the semiconductor device 33 according to the third embodiment (refer to FIG. 6) is compared to the second conventional example, the inventor confirmed that the turn-on loss Eon is 45% lower compared to the second conventional example.

In the foregoing, the present invention is not limited to the embodiments described above and various modifications within a range not departing from the spirit of the invention are possible. For example, in the embodiments described above, while an IGBT alone or a RC-IGBT is described, without limitation hereto, application is possible to a semiconductor device that has an IGBT portion in which an IGBT is disposed. Further, in the embodiments, while a first conductivity type is assumed to be an n-type and a second conductivity type is assumed to be a p-type, the present invention is similarly implemented when the first conductivity type is a p-type and the second conductivity type is an n-type.

According to the invention described above, during turn-on, parasitic capacitance between the first and third electrodes formed on the insulating film along the inner walls of the gate trenches increases and thus, during reverse recovery of the diode connected in antiparallel, the dV/dt (the reverse recovery dV/dt) of the voltage applied between the third and second electrodes may be reduced. Further, when the reverse recovery dV/dt is maintained, the gate resistance may be reduced, the dI/dt (the rate of current change per unit time) of the current flowing between the third and second electrodes may be increased, and the turn-on loss Eon may be suppressed.

The semiconductor device according to the present invention achieves an effect in that the tradeoff relationship between the turn-on loss Eon and the reverse recovery dV/dt maybe improved.

As described, the semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate having a first surface and a second surface that are opposite to each other;
   a first semiconductor region of a first conductivity type, the first semiconductor region being provided in the semiconductor substrate;
   a plurality of second semiconductor regions of a second conductivity type, the second semiconductor regions being provided between the first surface of the semiconductor substrate and the first semiconductor region;
   a plurality of third semiconductor regions of the first conductivity type, the third semiconductor regions being selectively provided between the first surface of the semiconductor substrate and the second semiconductor regions;

a fourth semiconductor region of the second conductivity type, the fourth semiconductor region being provided between the second surface of the semiconductor substrate and the first semiconductor region;

a plurality of trenches provided in the semiconductor substrate, from the first surface of the semiconductor substrate;

a plurality of first electrodes respectively provided in the plurality of trenches, each via an insulating film;

an interlayer insulating film provided on the first surface of the semiconductor substrate, the interlayer insulating film covering the first electrodes and having a plurality of contact holes formed therein;

a second electrode provided at the first surface of the semiconductor substrate, the second electrode being electrically connected to the second semiconductor regions and the third semiconductor regions via the plurality of contact holes of the interlayer insulating film; and a third electrode provided on the second surface of the semiconductor substrate, the third electrode being electrically connected to the fourth semiconductor region, wherein the trenches are disposed at equal intervals, so as to have a plurality of mesa portions formed therebetween, the trenches including a plurality of gate trenches that penetrate through the third semiconductor regions and the second semiconductor regions and reach the first semiconductor region, and a plurality of dummy trenches that penetrate through the second semiconductor regions and reach the first semiconductor region;

the first electrodes include:

a plurality of gate electrodes respectively provided in the gate trenches, and a plurality of dummy electrodes respectively provided in the dummy trenches and electrically connected to the second electrode; and the plurality of mesa portions includes a plurality of first mesa portions, each of the first mesa portions being provided between two of the gate trenches and including one of the second semiconductor regions that has a floating potential.

2. The semiconductor device according to claim 1, wherein the plurality of mesa portions further includes a plurality of second mesa portions, each of the second mesa portions being adjacent, respectively on two opposite sides thereof, to one of the gate trenches and one of the dummy trenches, and the second electrode is electrically connected to the second semiconductor regions and the third semiconductor regions, in the second mesa portions.

3. The semiconductor device according to claim 1, wherein the plurality of mesa portions further includes a plurality of third mesa portions, each of the third mesa portions being provided between two of the dummy trenches, and including one of the second semiconductor regions that has the floating potential.

4. The semiconductor device according to claim 3, wherein a quantity of the third mesa portions is greater than a quantity of the first mesa portions.

5. The semiconductor device according to claim 2, wherein at least two of the first mesa portions are disposed between two of the second mesa portions.

6. The semiconductor device according to claim 1, wherein the semiconductor substrate has:

a first device region, in which the first semiconductor region, the second semiconductor regions, the third semiconductor regions, the fourth semiconductor region, the gate trenches, the dummy trenches, the gate electrodes, the dummy electrodes, the second electrode, and the third electrode form a first device, and a second device region, in which the first semiconductor region, the second semiconductor regions, the dummy trenches, the dummy electrodes, the second electrode, and the third electrode form a second device, the first device region being adjacent to the second device region; and the semiconductor device further includes a fifth semiconductor region of the first conductivity type, the fifth semiconductor region being provided between the second surface of the semiconductor substrate and the first semiconductor region, the fifth semiconductor region being electrically connected to the third electrode and having an impurity concentration that is higher than an impurity concentration of the first semiconductor region.

* * * * *